US012400992B2

(12) United States Patent
Yang

(10) Patent No.: US 12,400,992 B2
(45) Date of Patent: Aug. 26, 2025

(54) SEMICONDUCTOR DEVICE WITH SUPPORTER AGAINST WHICH BONDING WIRE IS DISPOSED AND METHOD FOR PREPARING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 335 days.

(21) Appl. No.: 17/829,515

(22) Filed: Jun. 1, 2022

(65) Prior Publication Data

US 2023/0395557 A1 Dec. 7, 2023

(51) Int. Cl.
*H01L 23/00* (2006.01)
(52) U.S. Cl.
CPC .............. *H01L 24/48* (2013.01); *H01L 24/85* (2013.01); *H01L 2224/48227* (2013.01); *H01L 2224/48997* (2013.01); *H01L 2224/85007* (2013.01)
(58) Field of Classification Search
CPC ..................... H01L 24/48; H01L 24/85; H01L 2224/48227; H01L 2224/48997; H01L 2224/85007; H01L 2224/48992
See application file for complete search history.

(56) References Cited

U.S. PATENT DOCUMENTS

| 5,710,457 A | 1/1998 | Uno |
| 5,847,445 A * | 12/1998 | Wark ...................... H01L 24/48 257/E23.125 |
| 6,265,762 B1 * | 7/2001 | Tanaka ..................... H01L 24/06 257/676 |
| 6,313,519 B1 * | 11/2001 | Gainey ............. H01L 23/49503 257/676 |
| 2008/0026506 A1 | 1/2008 | Kim et al. |
| 2009/0078740 A1 * | 3/2009 | Silverbrook ............ H01L 24/78 228/4.5 |
| 2009/0189292 A1 | 7/2009 | Reiss et al. |
| 2015/0217569 A1 * | 8/2015 | Otaka ......................... B41J 2/16 29/841 |
| 2015/0270240 A1 * | 9/2015 | Tokubo ................... H01L 24/49 257/784 |

(Continued)

FOREIGN PATENT DOCUMENTS

| JP | 60210845 A | | 10/1985 | |
| JP | 63233544 A | * | 9/1988 | ............. H01L 24/05 |
| JP | 2008226943 A | * | 9/2008 | |

OTHER PUBLICATIONS

Office Action and Search Report mailed on Jul. 26, 2023 related to Taiwanese Application No. 111139660.

(Continued)

*Primary Examiner* — Teresa M. Arroyo
(74) *Attorney, Agent, or Firm* — Xuan Zhang

(57) ABSTRACT

A semiconductor device and method for manufacturing the same are provided. The semiconductor device includes a substrate, an electronic component, a bonding wire, and a supporter. The electronic component is disposed on the substrate. The bonding wire includes a first terminal connected to the electronic component and a second terminal connected to the substrate. The bonding wire is disposed against the supporter.

19 Claims, 14 Drawing Sheets

(56) References Cited

U.S. PATENT DOCUMENTS

2015/0294940 A1* 10/2015 Fay .................... H01L 23/5386
                                                       257/777
2018/0122770 A1*  5/2018 Auchere ................ H01L 24/48
2021/0210458 A1*  7/2021 Lee ....................... H01L 24/05

OTHER PUBLICATIONS

Office Action and Search Report mailed on Aug. 13, 2024 related to U.S. Appl. No. 17/829,601.
Office Action and and the search report mailed on Dec. 3, 2024 related to U.S. Appl. No. 17/829,601.

* cited by examiner

SEMICONDUCTOR DEVICE WITH SUPPORTER AGAINST WHICH BONDING WIRE IS DISPOSED AND METHOD FOR PREPARING THE SAME

TECHNICAL FIELD

The present disclosure relates to a semiconductor device and method for manufacturing the same, and more particularly, to a semiconductor device including a supporter against which a bonding wire is disposed.

DISCUSSION OF THE BACKGROUND

With the rapid growth of the electronics industry, integrated circuits (ICs) have achieved high performance and miniaturization. Technological advances in IC materials and design have produced generations of ICs in which each successive generation has smaller and more complex circuits.

Many techniques have been developed for integrating an electronic component and a substrate. For example, the electronic component and the substrate may be connected by a bonding wire. In order to prevent the bonding wire from being disposed against the corner of the electronic component, the bonding wire is lengthened, increasing the size of the semiconductor device and resistance thereof. Therefore, a new semiconductor device and method of improving such problems is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, an electronic component, a bonding wire, and a supporter. The electronic component is disposed on the substrate. The bonding wire includes a first terminal connected to the electronic component and a second terminal connected to the substrate. The bonding wire is disposed against the supporter.

Another aspect of the present disclosure provides another semiconductor device. The semiconductor device includes a substrate, an electronic component, a bonding wire, and a supporter. The electronic component is disposed on the substrate. The bonding wire includes a first terminal connected to the electronic component and a second terminal connected to the substrate. The supporter is disposed between the first terminal and the second terminal of the bonding wire.

Another aspect of the present disclosure provides a method of manufacturing a semiconductor device. The method includes providing a substrate. The method also includes attaching an electronic component to the substrate. The method further includes attaching a supporter to the substrate. In addition, the method includes forming a bonding wire connecting the substrate and the electronic component. The electronic component is disposed against the bonding wire.

In embodiments of the present disclosure, the semiconductor device may include a supporter utilized to fix bonding wire(s). The supporter may be disposed between two terminals of the bonding wire. The supporter may provide a smooth area, such as a smooth surface, a smooth edge, or a smooth corner on which the bonding wire is disposed. Thus, the bonding wire may be disposed against the supporter with a tolerable tension. The length of the bonding wire may be reduced, resulting in a relatively small semiconductor device and relatively low resistance of the bonding wire.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
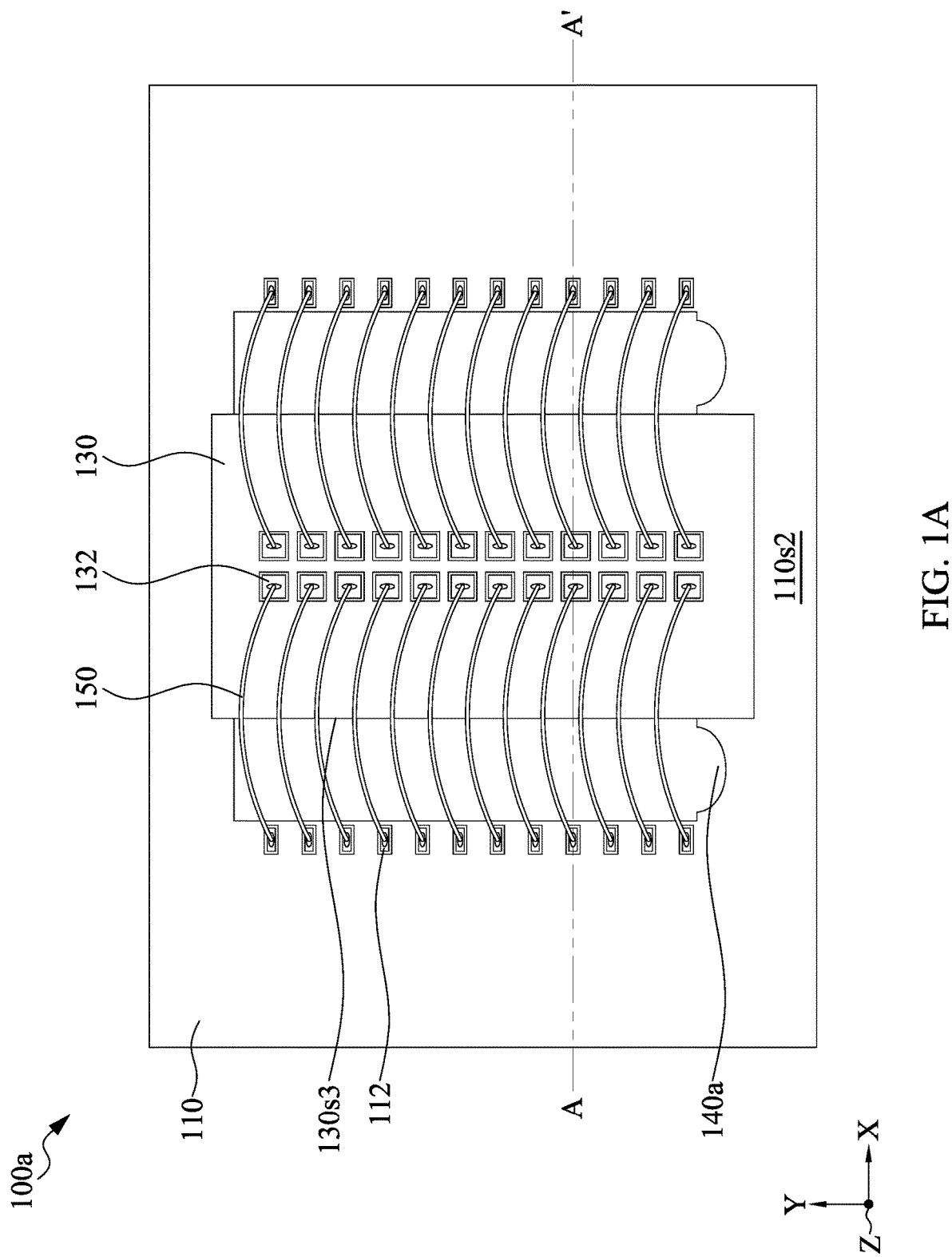
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
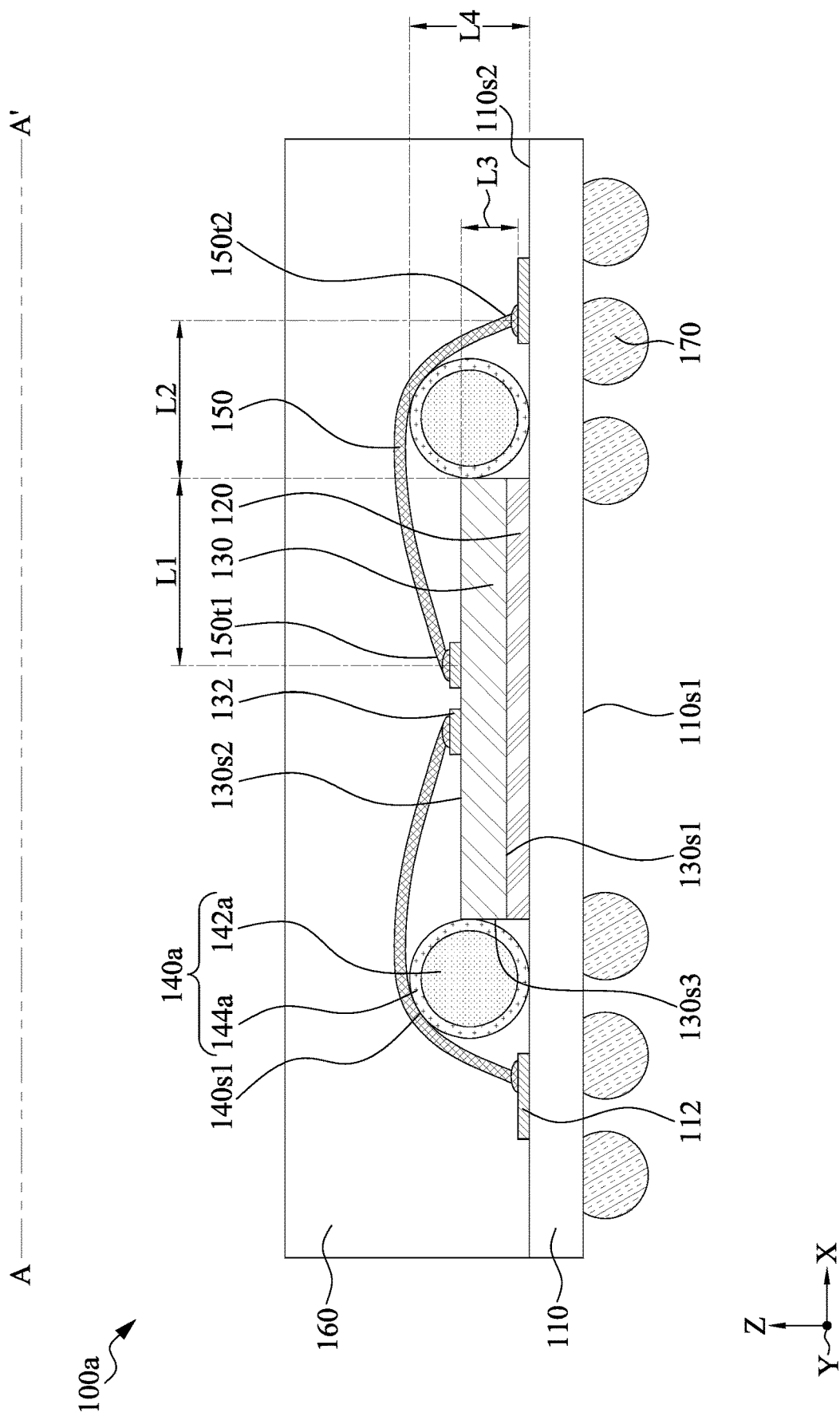
FIG. 1B is a cross-sectional view along line A-A' of the semiconductor device as shown in FIG. 1A, in accordance with some embodiments of the present disclosure.

FIG. 1A and FIG. 1B illustrate a semiconductor device 100*a*, in accordance with some embodiments of the present disclosure, wherein FIG. 1A is a top view, and FIG. 1B is a cross-sectional view along line A-A' of FIG. 1A.

In some embodiments, the semiconductor device 100*a* may include a substrate 110. In some embodiments, the substrate 110 may be or include, for example, a printed circuit board (PCB), such as a paper-based copper foil laminate, a composite copper foil laminate, or a polymer-impregnated glass-fiber-based copper foil laminate.

In some embodiments, the substrate 110 may include a surface 110*s*1 and a surface 110*s*2 opposite to the surface 110*s*1. In some embodiments, the surface 110*s*1 may also be referred to as a lower surface. In some embodiments, the surface 110*s*2 may also be referred to as an upper surface.

In some embodiments, the substrate 110 may include conductive pad(s), trace(s), via(s), layer(s), or other interconnection(s). For example, the substrate 110 may include one or more transmission lines (e.g., communications cables) and one or more grounding lines and/or grounding planes. For example, the substrate 110 may include one or more conductive pads (e.g., 112) in proximity to, adjacent to, or embedded in and exposed at the surface 110*s*1 and/or the surface 110*s*2 of the substrate 110.

In some embodiments, the semiconductor device 100*a* may include an adhesive layer 120. In some embodiments, the adhesive layer 120 may be disposed on the surface 110*s*2 of the substrate 110.

In some embodiments, the semiconductor device 100*a* may include an electronic component 130. In some embodiments, the electronic component 130 may be disposed on the surface 110*s*2 of the substrate 110. In some embodiments, the electronic component 130 may be attached to the surface 110*s*2 of the substrate 110 through the adhesive layer 120.

In some embodiments, the electronic component 130 may include a memory device, such as a dynamic random access memory (DRAM) device, a one-time programming (OTP) memory device, a static random access memory (SRAM) device, or other suitable memory devices. In some embodiments, the electronic component 130 may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The electronic component 130 may have a surface 130*s*1 and a surface 130*s*2 opposite to the surface 130*s*1. In some embodiments, the surface 130*s*1 may also be referred to as a backside surface or a lower surface. In some embodiments, the surface 130*s*2 may also be referred to as an active surface or an upper surface. As used herein, the term "active surface" may refer to a surface on which terminal(s) is disposed for transmitting and/or receiving signals. In some embodiments, the surface 130*s*1 of the electronic component 130 may face the surface 110*s*2 of the substrate 110. The electronic component 130 may have a surface 130*s*3 (or a lateral surface) extending between the surfaces 130*s*1 and 130*s*2 of the electronic component 130.

In some embodiments, the electronic component 130 may include conductive pads 132. The conductive pad 132 may be disposed on the surface 130*s*2 of the electronic component 130. In some embodiments, the conductive pad 132 may include metal, such as copper (Cu), tungsten (W), silver (Ag), gold (Au), ruthenium (Ru), iridium (Ir), nickel (Ni), osmium (Os), ruthenium (Rh), aluminum (Al), molybdenum (Mo), cobalt (Co), alloys thereof, combinations thereof or other suitable materials.

In some embodiments, the semiconductor device 100*a* may include supporter(s) 140*a*. In some embodiments, the supporters 140*a* may be disposed on the surface 110*s*2 of the substrate 110. In some embodiments, the supporters 140*a* may be disposed on two opposite surfaces 130*s*3 of the electronic component 130. However, the present disclosure is not intended to be limiting.

In some embodiments, the supporter 140*a* may be configured to provide an area, such as a surface, an edge, or a corner, against which a bonding wire (or a conductive wire) is disposed. In some embodiments, at least a portion of the supporter 140*a* may have a rounded surface, a rounded edge, or a rounded corner against which a conductive wire is disposed. In some embodiments, at least a portion of the spacer 142*a* may have a smooth surface, a smooth edge, or a smooth corner against which a conductive wire is disposed. As used herein, the term "smooth surface, edge, or corner" may refer to a surface, edge, or corner which may be relatively blunt.

In some embodiments, the supporter 140a may be in contact with the surface 110s2 of the substrate 110. In some embodiments, the supporter 140a may be in contact with the surface 130s3 of the electronic component 130. In some embodiments, the supporter 140a may be disposed against the electronic component 130. In some embodiments, the supporter 140a may be disposed against the surface 130s3 of the electronic component 130. As used herein, the term "X is disposed against Y" may mean that X imposes a force or a stress, in addition to or other than a gravitational force, on Y.

In some embodiments, the supporter 140a may include a spacer 142a and an adhesive element 144a. In some embodiments, at least a portion of the spacer 142a may have a rounded surface, a rounded edge, or a rounded corner against which a conductive wire is disposed. In some embodiments, at least a portion of the spacer 142a may have a smooth surface, a smooth edge, or a smooth corner against which a conductive wire is disposed. In some embodiments, the spacer 142a may include an electrical insulative material or an electrically conductive material. In some embodiments, the spacer 142a may include resin, glass, or other suitable materials. The spacer 142a may include metal, alloy or other suitable materials. In some embodiments, the spacer 142a may be circular, elliptical, or other profile shape.

In some embodiments, the adhesive element 144a may cover an external surface (not annotated in the figures) of the spacer 142a. In some embodiments, the adhesive element 144a may enclose the spacer 142a. In some embodiments, the adhesive element 144a may be conformally disposed on the spacer 142a. In some embodiments, the adhesive element 144a may include an electrically insulative material.

In some embodiments, the semiconductor device 100a may include bonding wire(s) 150. In some embodiments, each of the bonding wires 150 may have a terminal 150t1 connected to (or bonded to) the surface 130s2 of the electronic component 130 and a terminal 150t2 connected to (or bonded to) the surface 110s2 of the substrate 110. In some embodiments, the terminal 150t1 of the bonding wire 150 may be bonded to the conductive pad 132 of the electronic component 130. In some embodiments, the terminal 150t2 of the bonding wire 150 may be bonded to the conductive pad 112 of the substrate 110. In some embodiments, the supporter 140a may be disposed between the terminals 150t1 and 150t2 of the bonding wire 150. In some embodiments, the bonding wire 150 may include metal, such as copper (Cu), silver (Ag), gold (Au), nickel (Ni), aluminum (Al), alloys thereof, combinations thereof, or other suitable materials.

In some embodiments, the bonding wire 150 may be disposed on the supporter 140a. In some embodiments, the bonding wire 150 may be disposed against the supporter 140a. In some embodiments, the bonding wire 150 may be disposed against a smooth (or rounded) area 140s1, such as surface, edge, or corner, of the supporter 140a. In some embodiments, the bonding wire 150 may be in contact with the supporter 140a, resulting in force or a stress imposed on the supporter 140a. Thus, the supporter 140a may be disposed against the electronic component 130 through the supporter 140a.

The terminal 150t1 of the bonding wire 150 and the surface 130s3 of the electronic component 130 may have a length L1, along the X-axis, therebetween. The terminal 150t2 of the bonding wire 150 and the surface 130s3 of the electronic component 130 may have a length L2, along the X-axis, therebetween. In some embodiments, the length L1 may substantially equal or exceed the length L2. In some embodiments, a ratio between the length L1 and the length L2 may range from about 1.1 to about 3, such as 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, or 3.

When the ratio between the lengths L1 and L2 ranges from about 1.1 to about 3, the bonding wire 150 may be disposed against the supporter 140a with relatively little tension, which thereby prevents the bonding wire 150 from being broken. Further, the supporter 140a may result in a relatively small sum of the lengths L1 and L2, which thereby reduces the size of the semiconductor device 100a. Further, as the length of the bonding wire 150 decreases, the resistance of the bonding wire is correspondingly reduced.

The surface 130s2 of the electronic component 130 and the terminal 150t1 (or terminal 150t2) of the bonding wire 150 may have a length L3, along the Y-axis, therebetween. The supporter 140a may have a length L4 (or thickness or diameter) along the Y-axis. In some embodiments, the length L4 may exceed the length L3. In some embodiments, the ratio between the lengths L3 and the L4 may range from about 1.2 to about 1.8, such as 1.2, 1.3, 1.4, 1.5, 1.6, 1.7 or 1.8.

When the ratio between the lengths L3 and L4 ranges from about 1.2 to about 1.8, the bonding wire 150 may be disposed against the supporter 140a with relatively little tension, which thereby prevents the bonding wire 150 from being broken.

As shown in FIG. 1A, multiple bonding wires 150 may share a common supporter 140a. In some embodiments, the supporter 140a may be in contact with a plurality of bonding wires 150. In some embodiments, the bonding wire 150 may extend along the X-axis. In some embodiments, the supporter 140a may extend along the Y-axis.

In some embodiments, the semiconductor device 100a may include an encapsulant 160. In some embodiments, the encapsulant 160 may be disposed on the surface 110s2 of the substrate 110. In some embodiments, the encapsulant 160 may cover the surface 110s2 of the substrate 110. In some embodiments, the encapsulant 160 may encapsulate the supporter 140a. In some embodiments, the encapsulant 160 may encapsulate the bonding wire 150. The encapsulant 160 may include insulative or dielectric material. In some embodiments, the encapsulant 160 may be made of molding material that may include, for example, a Novolac-based resin, an epoxy-based resin, a silicone-based resin, or other suitable encapsulant. Suitable fillers may also be included, such as powdered $SiO_2$.

In some embodiments, the semiconductor device 100a may include electrical connections 170. The electrical connection 170 may be disposed on the surface 110s1 of the substrate 110. In some embodiments, the electrical connection 170 may be configured to electrically connect the semiconductor device 100a and an external device (not shown). In some embodiments, the electrical connection 170 may include solder material, such as alloys of gold and tin solder or alloys of silver and tin solder.

In a comparative example, bonding wires are connected between an electronic component and a substrate without a supporter. In such condition, the length of the bonding wire should be greater than a predetermined value in order to prevent the bonding wire from being disposed against the corner of the electronic component. If not, the bonding wire may be prone to breakage due to relatively high tension. Therefore, the comparative example may have a relatively large width. In embodiments of the present disclosure, the bonding wires can be disposed against a smooth area, such as a surface, an edge, or a corner, of the supporter with relatively little tension. Further, the length of the bonding wire may be reduced, resulting in a relatively small size of the semiconductor device and a relatively small resistance.

Figure 2:
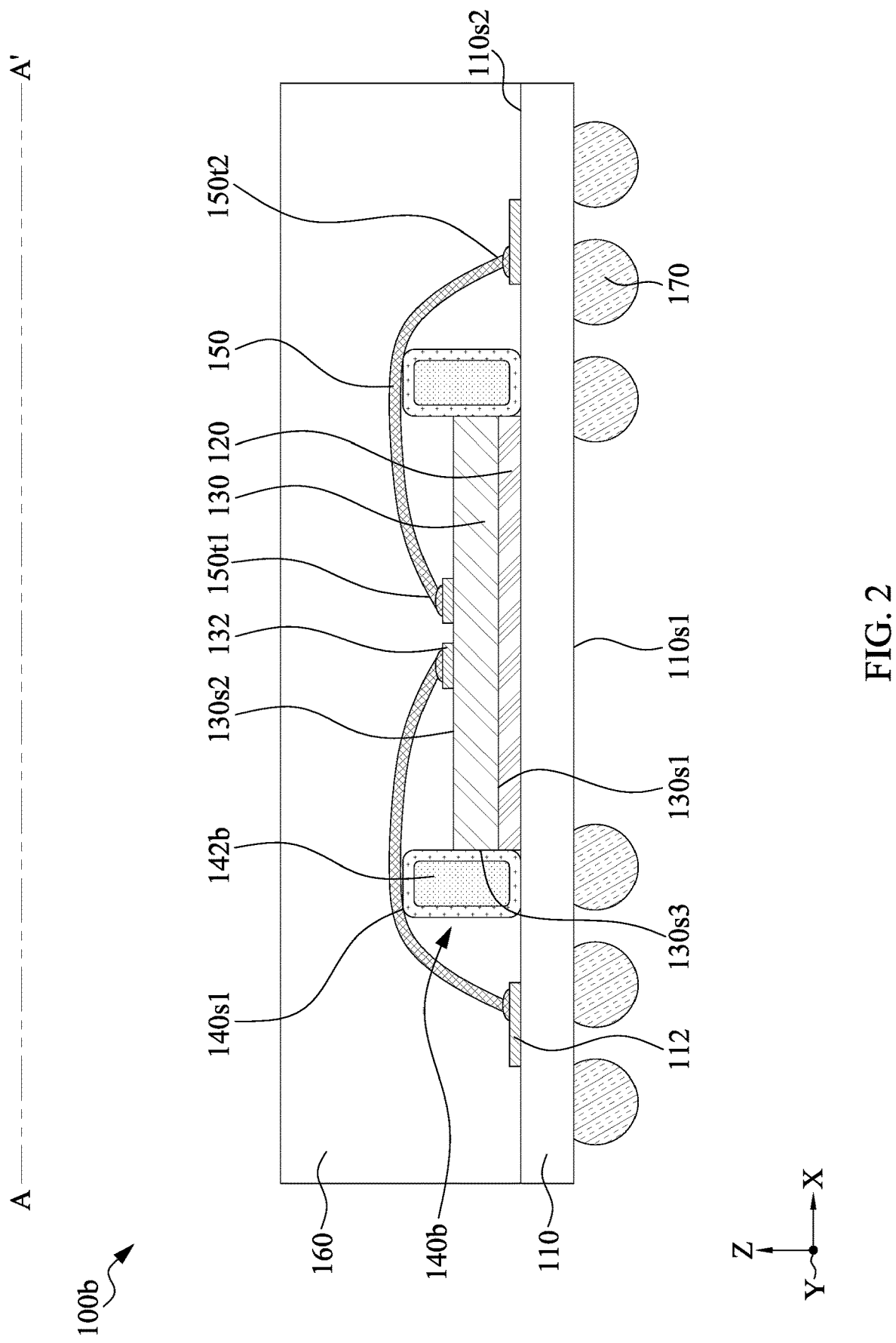
FIG. 2 is a cross-sectional view of a semiconductor device, in accordance with some embodiments of the present disclosure.

FIG. 2 is a cross-sectional view of a semiconductor device 100b, in accordance with some embodiments of the present disclosure. The semiconductor device 100b is similar to the semiconductor device 100a as shown in FIG. 1B, and the differences therebetween are described below.

In some embodiments, the semiconductor device 100b may include a supporter 140b. The supporter 140b may include a spacer 142b. In some embodiments, the spacer 142b may be rectangular, square, or other suitable profile shape. In some embodiments, the supporter 140b may have a rounded surface, a rounded edge, or a rounded corner against which the bonding wire 150 is disposed. In some embodiments, at least a portion of the supporter 140b may have a smooth surface, a smooth edge, or a smooth corner against which the bonding wire 150 is disposed.

In some embodiments, the supporter 140b may be fully in contact with the surface 130s3 of the electronic component 130. In some embodiments, at least a portion of the spacer 142b may have a rounded surface, a rounded edge, or a rounded corner against which the bonding wire 150 is disposed. In some embodiments, at least a portion of the spacer 142b may have a smooth surface, a smooth edge, or a smooth corner against which the bonding wire 150 is disposed. Therefore, the bonding wire 150 may have relatively little tension imposed on the bonding wire 150.

Figure 3:
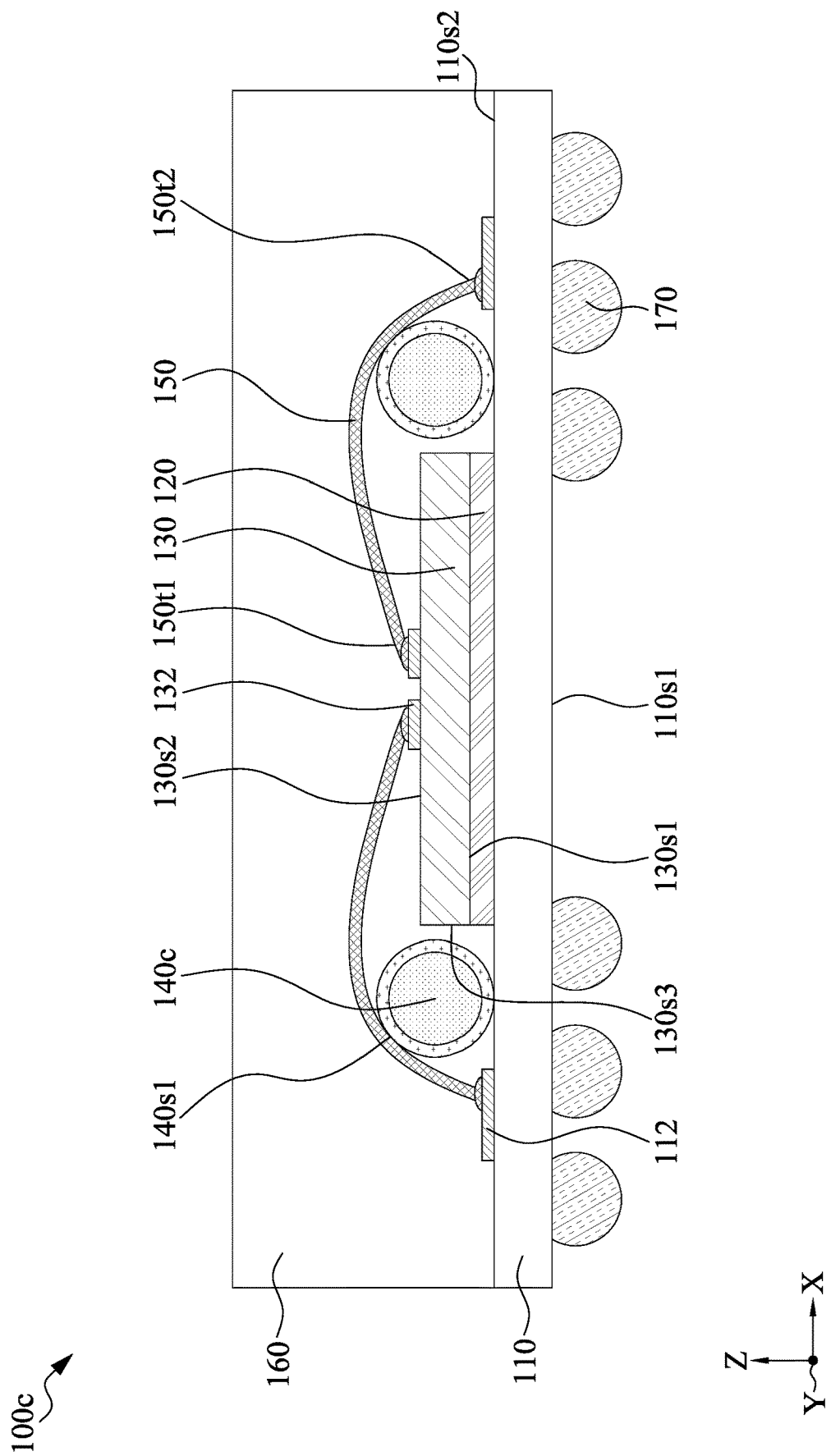
FIG. 3 is a cross-sectional view of a semiconductor device, in accordance with some embodiments of the present disclosure.

FIG. 3 is a cross-sectional view of a semiconductor device 100c, in accordance with some embodiments of the present disclosure. The semiconductor device 100c is similar to the semiconductor device 100a as shown in FIG. 1B, and the differences therebetween are described below.

In some embodiments, the semiconductor device 100c may include a supporter 140c. In some embodiments, the supporter 140c may be disposed on the surface 110s2 of the substrate 110 and spaced apart from the surface 130s3 of the electronic component 130. In some embodiments, the supporter 140c may provide a smooth (or rounded) surface, edge, or corner against which the bonding wire 150 is disposed. In some embodiments, at least a portion of the supporter 140c may have a smooth surface, a smooth edge, or a smooth corner against which the bonding wire 150 is disposed.

When the supporter 140c is spaced apart from the electronic component 130, the thickness (or diameter) of the supporter 140c may be reduced. Therefore, the size of the semiconductor device 100c may be reduced.

Figure 4:
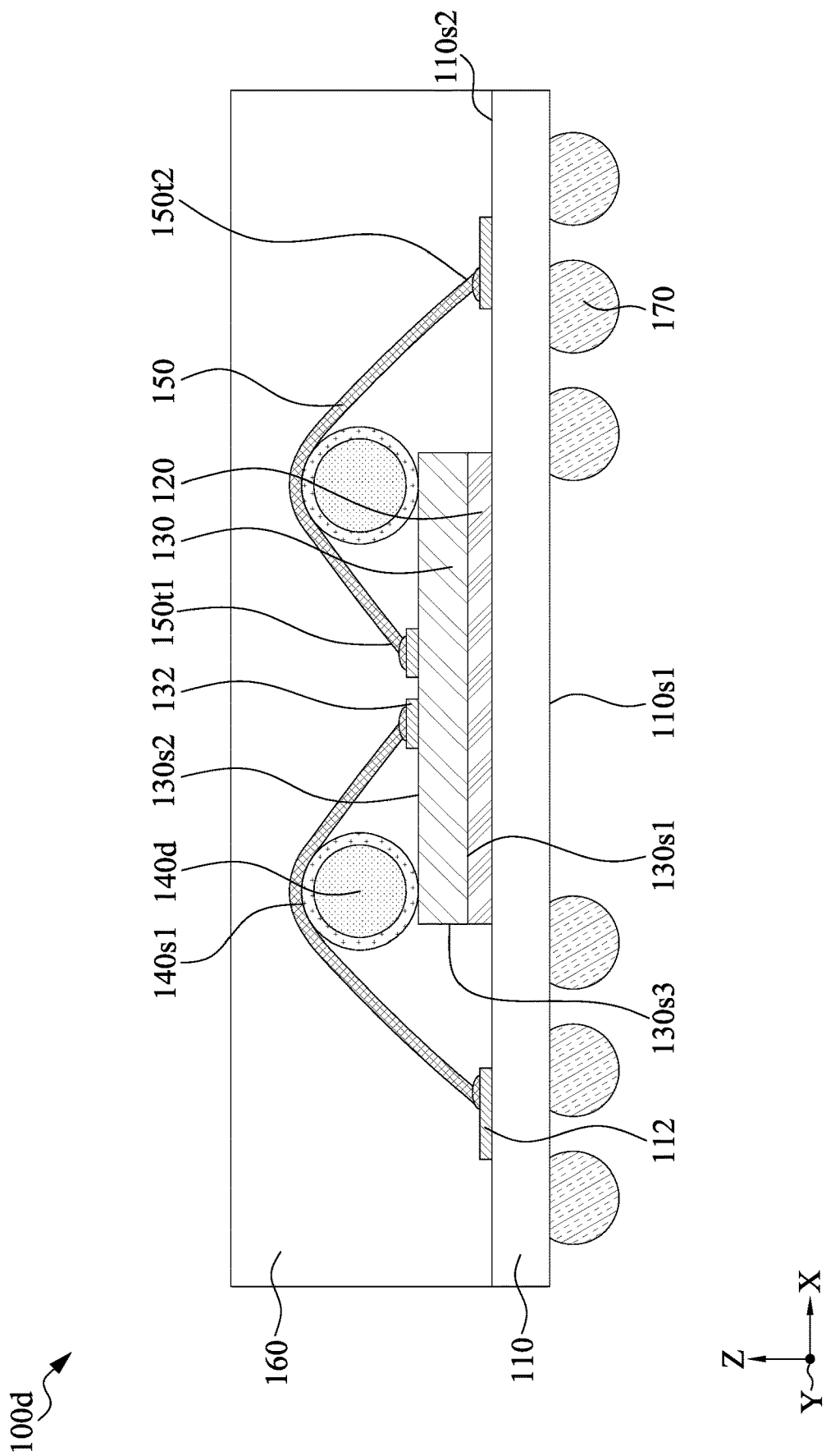
FIG. 4 is a cross-sectional view of a semiconductor device, in accordance with some embodiments of the present disclosure.

FIG. 4 is a cross-sectional view of a semiconductor device 100d, in accordance with some embodiments of the present disclosure. The semiconductor device 100d is similar to the semiconductor device 100a as shown in FIG. 1B, and the differences therebetween are described below.

In some embodiments, the semiconductor device 100d may include a supporter 140d. In some embodiments, the supporter 140d may be disposed on the surface 130s2 of the electronic component 130. In some embodiments, the supporter 140d may be disposed against the surface 130s2 of the electronic component 130. In some embodiments, the supporter 140d may be in contact with the surface 130s2 of the electronic component 130. In some embodiments, the supporter 140c may be spaced apart from the surface 110s2 of the substrate 110. In some embodiments, the supporter 140d may provide a smooth (or rounded) surface, edge, or corner against which the bonding wire 150 is disposed.

When the supporter 140d is disposed on the electronic component 130, the length of the bonding wire 150 along the X-axis may be reduced. Therefore, the size of the semiconductor device 100d may be reduced.

Figure 5:
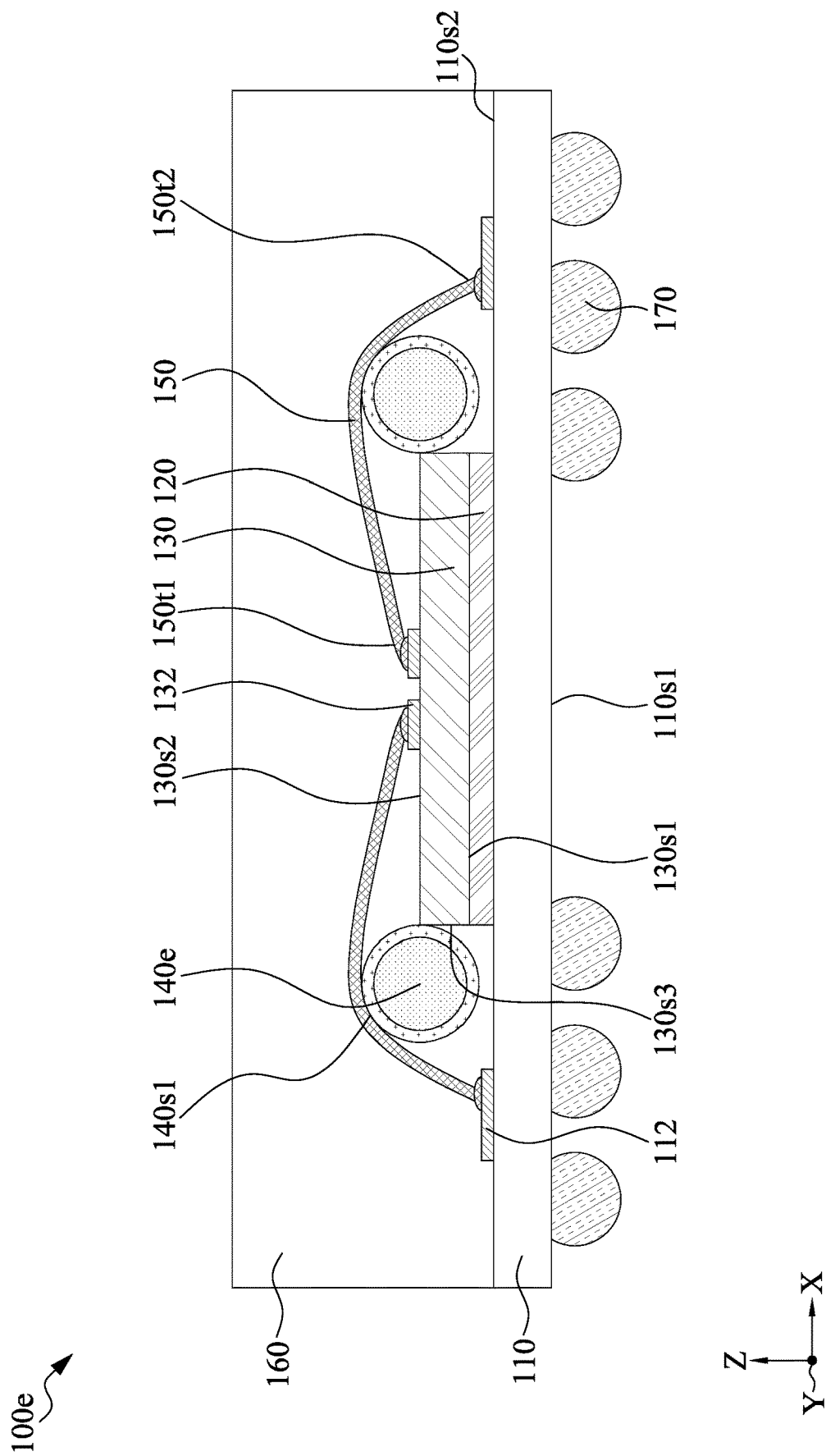
FIG. 5 is a cross-sectional view of a semiconductor device, in accordance with some embodiments of the present disclosure.

FIG. 5 is a cross-sectional view of a semiconductor device 100e, in accordance with some embodiments of the present disclosure. The semiconductor device 100e is similar to the semiconductor device 100a as shown in FIG. 1B, and the differences therebetween are described below.

In some embodiments, the semiconductor device 100e may include a supporter 140e. In some embodiments, the supporter 140e may be disposed on the surface 130s3 of the electronic component 130. In some embodiments, the supporter 140e may be in contact with the surface 130s3 of the substrate 110. In some embodiments, the supporter 140e may be spaced apart from the surface 130s2 of the electronic component 130. In some embodiments, the supporter 140e may be spaced apart from the surface 110s2 of the substrate 110. In some embodiments, the supporter 140e may provide a smooth (or rounded) surface, edge, or corner against which the bonding wire 150 is disposed.

The tension of the bonding wire 150 may be adjusted by modifying the location of the supporter 140e. Thus, the length and the tension of the bonding wire 150 may be optimized.

Figure 6:
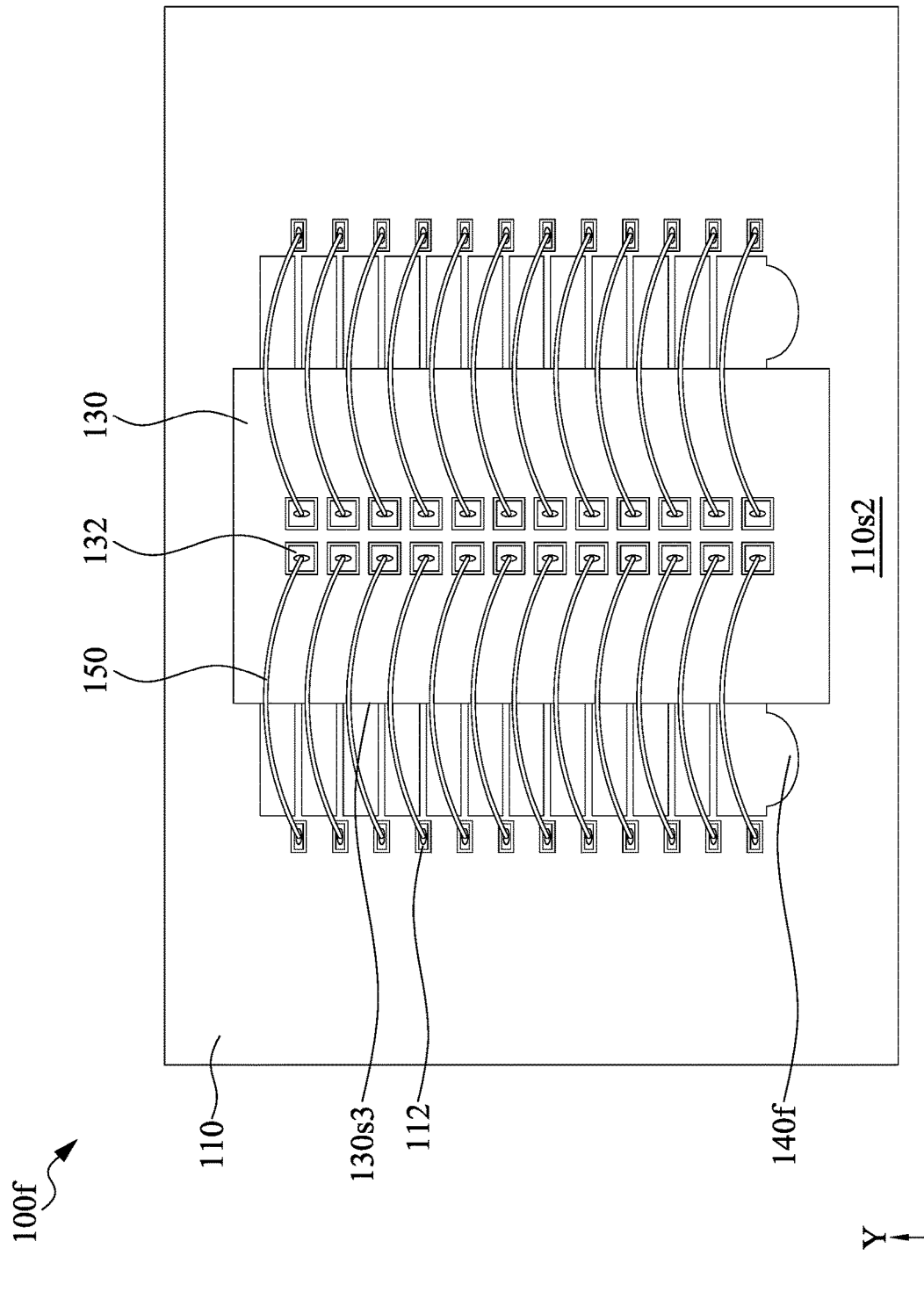
FIG. 6 is a top view of a semiconductor device, in accordance with some embodiments of the present disclosure.

FIG. 6 is a top view of a semiconductor device 100f, in accordance with some embodiments of the present disclosure. The semiconductor device 100f is similar to the semiconductor device 100a as shown in FIG. 1A, and the differences therebetween are described below.

In some embodiments, the semiconductor device 100f may include a plurality of supporters 140f. In some embodiments, each of the supporters 140f may provide a smooth (or rounded) surface, edge, or corner against which the bonding wire 150 is disposed. Each of the supporters 140f may correspond to one of the bonding wires 150. In some embodiments, each of the supporters 140f may be in contact with a corresponding bonding wire 150.

Figure 7:
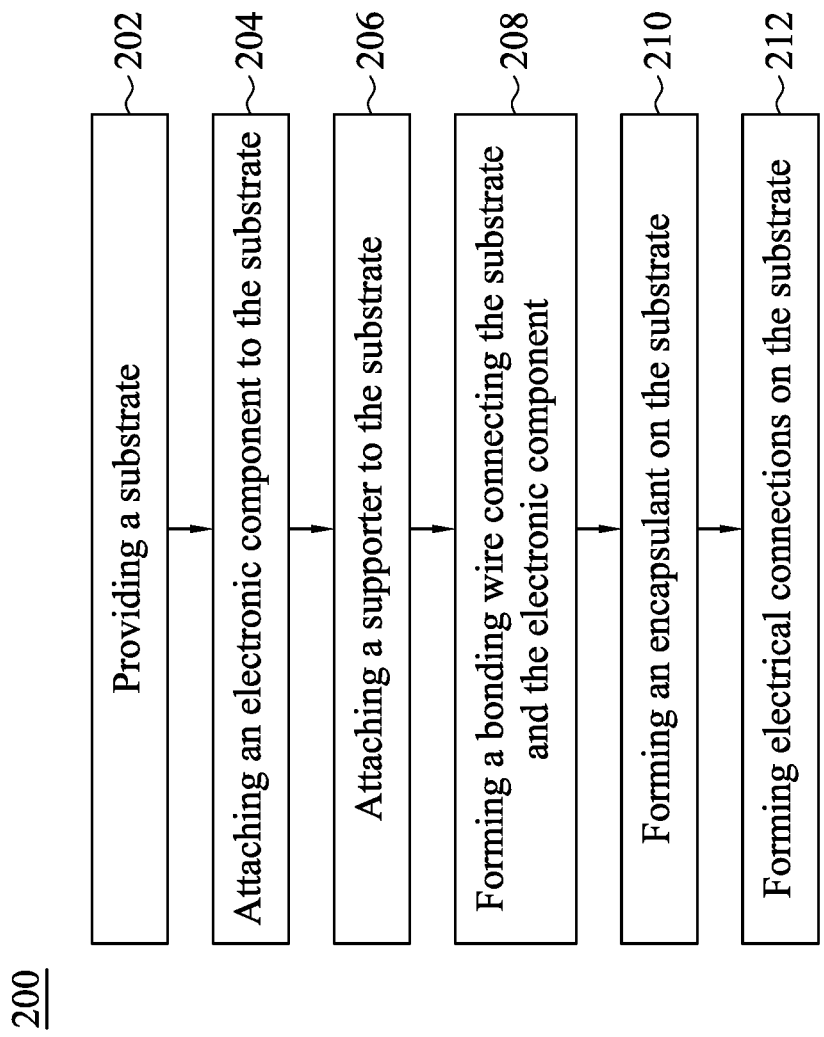
FIG. 7 is a flowchart illustrating a method of manufacturing a semiconductor device, in accordance with some embodiments of the present disclosure.

FIG. 7 is a flowchart illustrating a method 200 of manufacturing a semiconductor device, in accordance with some embodiments of the present disclosure.

The method 200 begins with operation 202 in which a substrate may be provided. The substrate may have a lower surface and an upper surface opposite to the lower surface. The substrate may include one or more conductive pads in proximity to, adjacent to, or embedded in and exposed at the lower surface and/or the upper surface of the substrate.

The method 200 continues with operation 204 in which an electronic component may be formed on the upper surface of the substrate. In some embodiments, the electronic component may be attached to the upper surface of the substrate by an adhesive layer. The electronic component may have a rear surface, an active surface, and a lateral surface extending between the rear surface and active surface of the electronic component. The electronic component may have a conductive pad on the active surface of the electronic component.

The method 200 continues with operation 206 in which a supporter may be formed on the upper surface of the substrate. In some embodiments, the supporter may be in contact with the upper surface of the substrate. In some embodiments, the supporter may be in contact with the lateral surface of the electronic component. In some embodiments, at least a portion of the supporter may have a rounded surface, a rounded edge, or a rounded corner. In some embodiments, at least a portion of the supporter may have a smooth surface, a smooth edge, or a smooth corner.

In some embodiments, the supporter may have a spacer and an adhesive element. In some embodiments, at least a portion of the spacer may have a rounded surface, a rounded edge, or a rounded corner. In some embodiments, at least a portion of the spacer may have a smooth surface, a smooth edge, or a smooth corner. In some embodiments, the adhesive element is conformally formed on the spacer.

The method 200 continues with operation 208 in which a bonding wire may be formed. In some embodiments, the bonding wire may have a first terminal connected to the electronic component and a second terminal connected to the substrate. In some embodiments, the bonding wire may be disposed against the supporter. In some embodiments, a portion of the bonding wire may be in contact with the supporter. In some embodiments, at least a portion of the bonding wire may be disposed against a smooth area, such as a surface, an edge, or a corner, of the supporter.

The method 200 continues with operation 210 in which an encapsulant may be formed on the upper surface of the substrate. In some embodiments, the encapsulant may encapsulate the electronic component, the supporter, and the bonding wire.

The method 200 continues with operation 212 in which electrical connections may be formed on the lower surface of the substrate, which thereby produces a semiconductor device.

In embodiments of the present disclosure, the semiconductor device may include a supporter. The supporter may be disposed between two terminals of the bonding wire. The bonding wire may be disposed against a smooth area, such as a surface, an edge, or a corner, of the supporter with relatively little tension. Further, the length of the bonding wire may be reduced, resulting in a relatively small size of the semiconductor device and a relatively small resistance of the bonding wire.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 7. In some embodiments, the method 200 can include one or more operations depicted in FIG. 7.

FIG. 8A-FIG. 8F illustrate one or more stages of an exemplary method for manufacturing a semiconductor device according to some embodiments of the present disclosure. In some embodiments, the semiconductor device 100a may be manufactured through the operations described with respect to FIG. 8A-FIG. 8F.

Figure 8A:
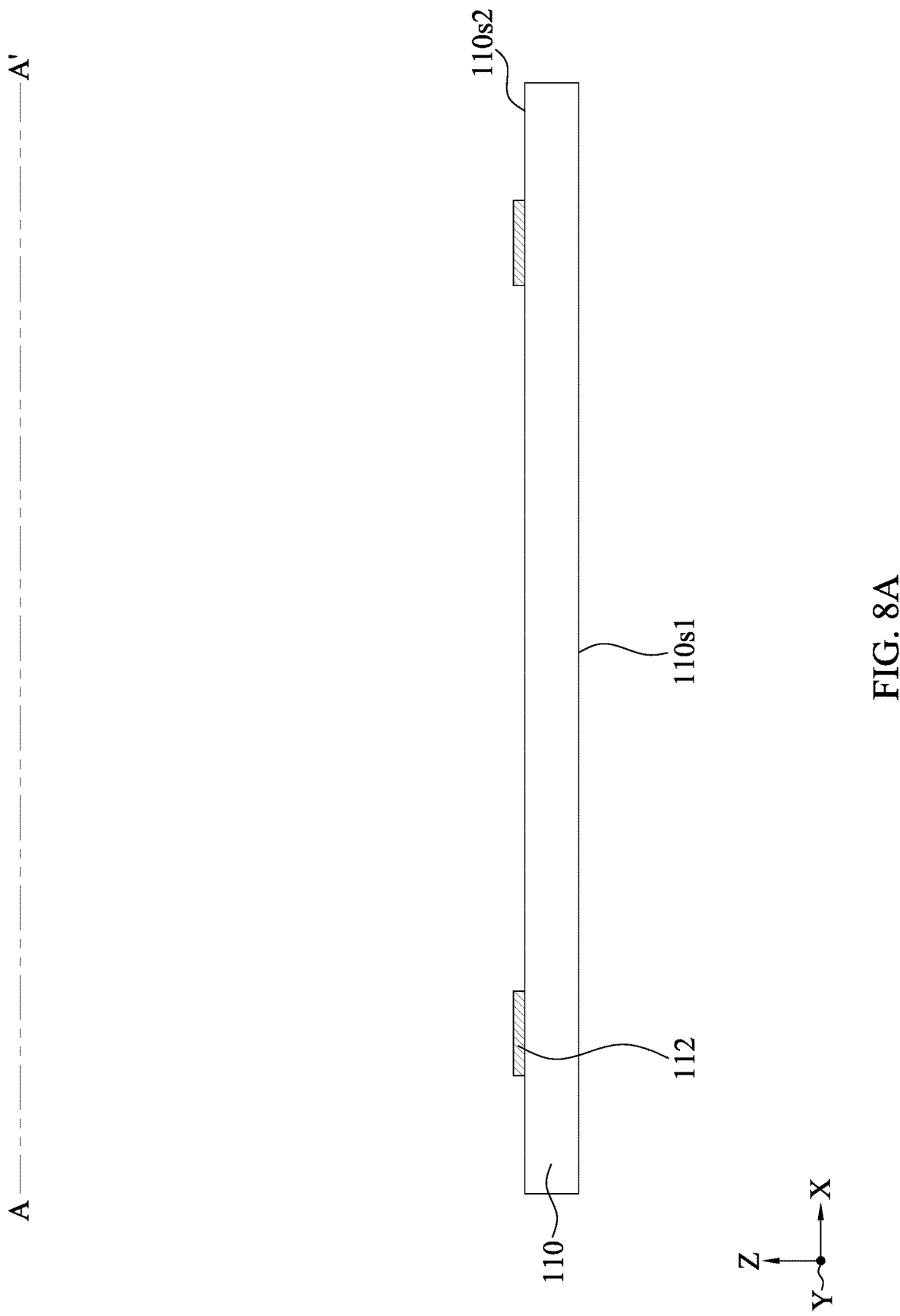
FIG. 8A illustrates one or more stages of an exemplary method for manufacturing a semiconductor device according to some embodiments of the present disclosure.

Referring to FIG. 8A, a substrate 110 may be provided. The substrate 110 may have a surface 110s1 and a surface 110s2 opposite to the surface 110s1. The substrate 110 may include one or more conductive pads (e.g., 112) in proximity to, adjacent to, or embedded in and exposed at the surface 110s1 and/or the surface 110s2 of the substrate.

Figure 8B:
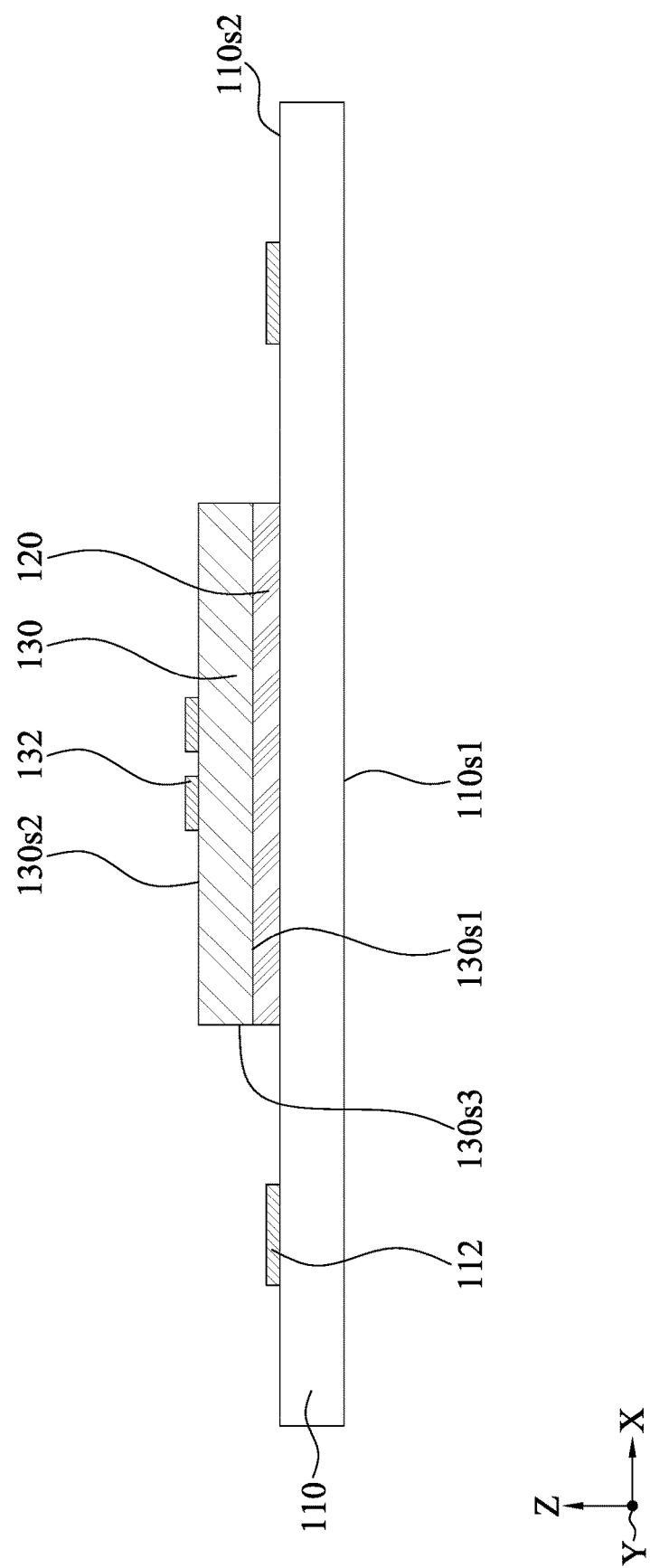
FIG. 8B illustrates one or more stages of an exemplary method for manufacturing a semiconductor device according to some embodiments of the present disclosure.

Referring to FIG. 8B, an electronic component 130 may be formed on the surface 110s2 of the substrate 110. In some embodiments, the electronic component 130 may be attached to the surface 110s2 of the substrate 110 by an adhesive layer 120. The electronic component 130 may have a surface 130s1, a surface 130s2, and a surface 130s3 extending between the surfaces 130s1 and 130s2 of the electronic component 130. The electronic component 130 may have a conductive pad 132 on the surface 130s2 of the electronic component 130.

Figure 8C:
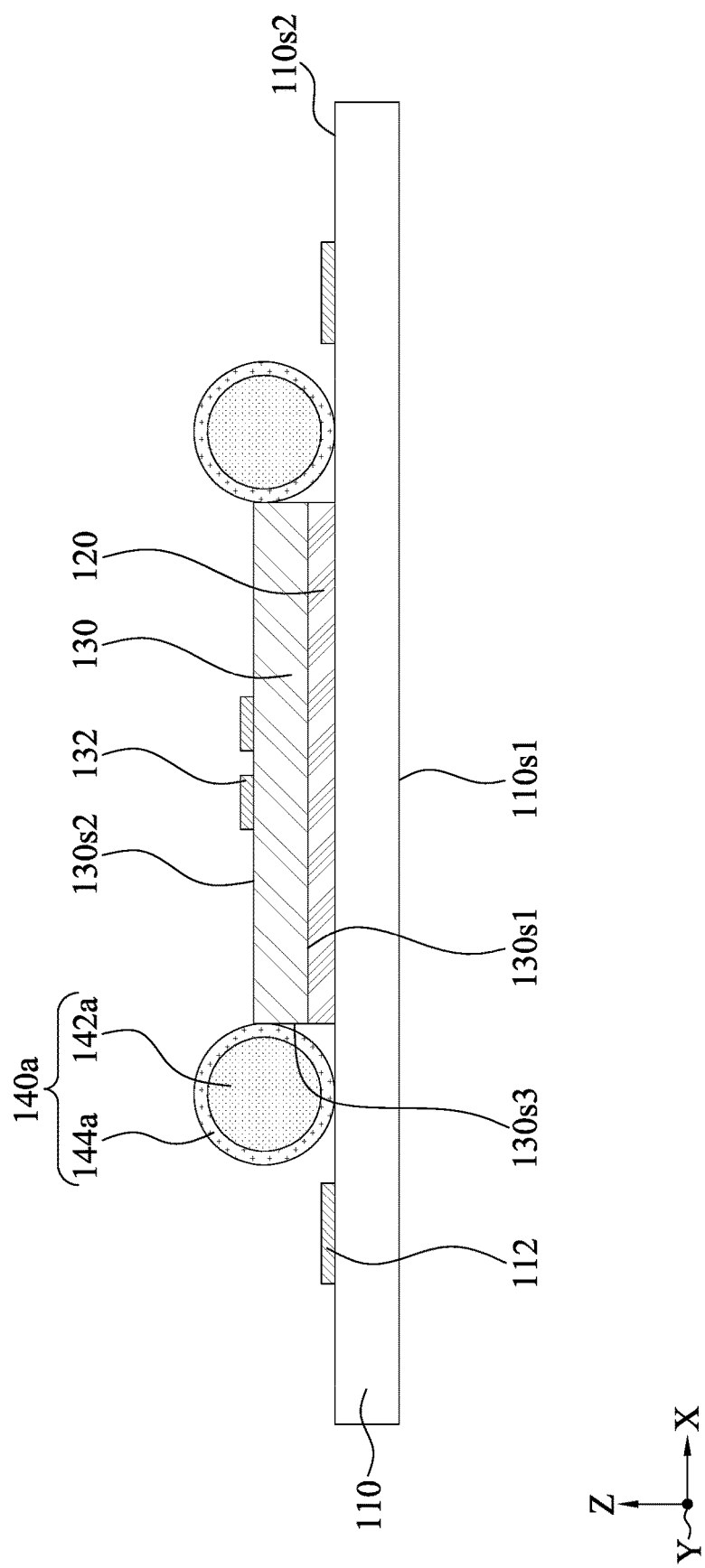
FIG. 8C illustrates one or more stages of an exemplary method for manufacturing a semiconductor device according to some embodiments of the present disclosure.

Referring to FIG. 8C, a supporter 140a may be formed on the surface 110s2 of the substrate 110. In some embodiments, the supporter 140a may be in contact with the surface 110s2 of the substrate 110. In some embodiments, the supporter 140a may be in contact with the surface 130s3 of the electronic component 130. In some embodiments, at least a portion of the supporter 140a may have a rounded surface, a rounded edge, or a rounded corner. In some embodiments, at least a portion of the supporter 140a may have a smooth surface, a rounded edge, or a rounded corner.

In some embodiments, the supporter 140a may have a spacer 142a and an adhesive element 144a. In some embodiments, at least a portion of the spacer 142a may have a rounded surface, a rounded edge, or a rounded corner. In some embodiments, at least a portion of the spacer 142a may have a smooth surface, a smooth edge, or a smooth corner. In some embodiments, the adhesive element 144a is conformally formed on the spacer 142a.

Figure 8D:
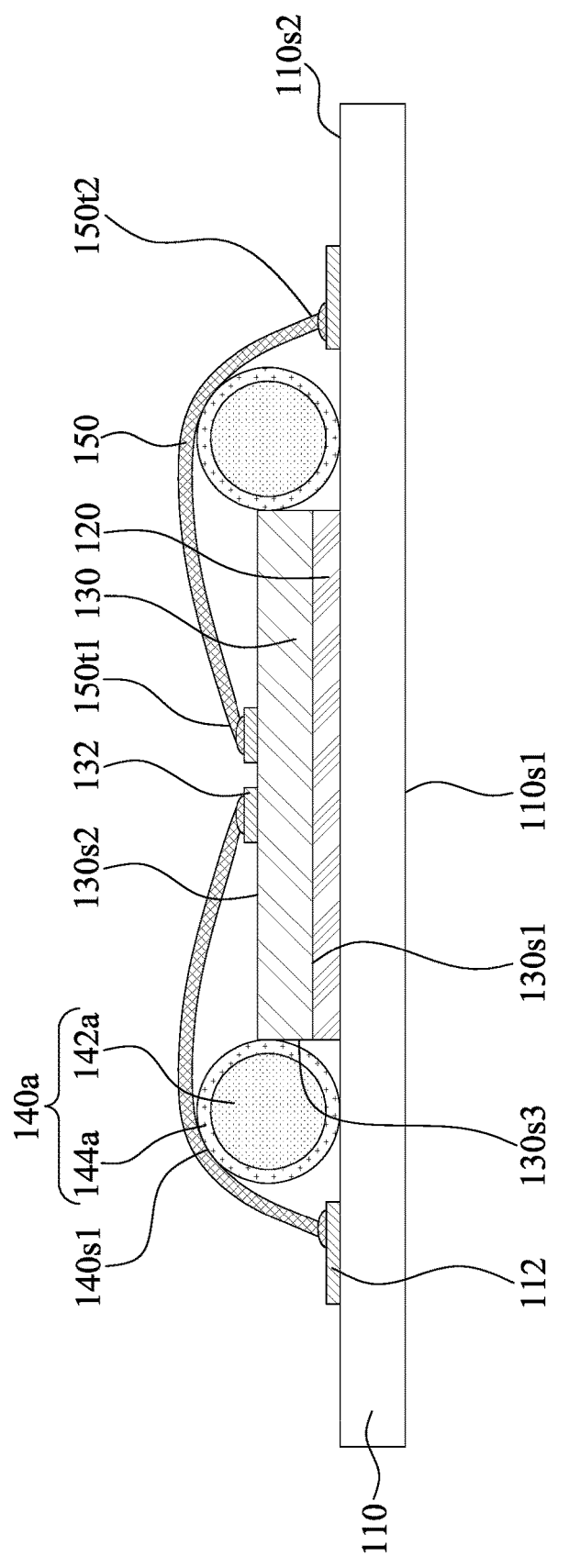
FIG. 8D illustrates one or more stages of an exemplary method for manufacturing a semiconductor device according to some embodiments of the present disclosure.

Referring to FIG. 8D, a bonding wire 150 may be formed. In some embodiments, the bonding wire 150 may have a terminal 150t1 connected to the electronic component 130 and a terminal 150t2 connected to the substrate 110. In some embodiments, the bonding wire 150 may be disposed against the supporter 140a. In some embodiments, at least a portion of the bonding wire 150 may be disposed against a smooth area 140s1, such as a surface, an edge, or a corner, of the supporter 140a. In some embodiments, a portion of the bonding wire 150 may be in contact with the supporter 140a.

Figure 8E:
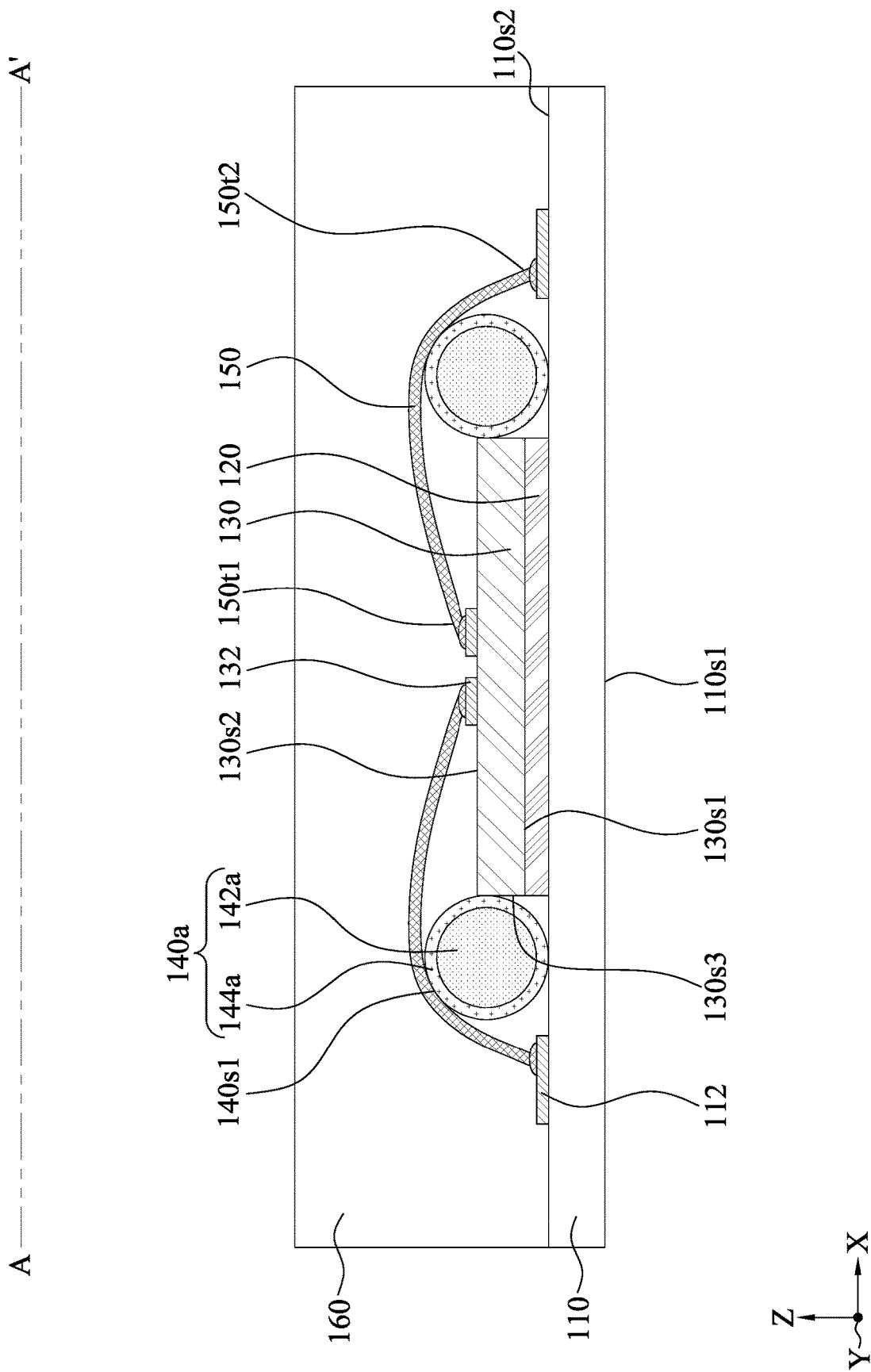
FIG. 8E illustrates one or more stages of an exemplary method for manufacturing a semiconductor device according to some embodiments of the present disclosure.

Referring to FIG. 8E, an encapsulant 160 may be formed on the surface 110s2 of the substrate 110. The encapsulant 160 may be formed by a molding operation. In some embodiments, the encapsulant 160 may encapsulate the electronic component 130, the supporter 140a, and the bonding wire 150.

Figure 8F:
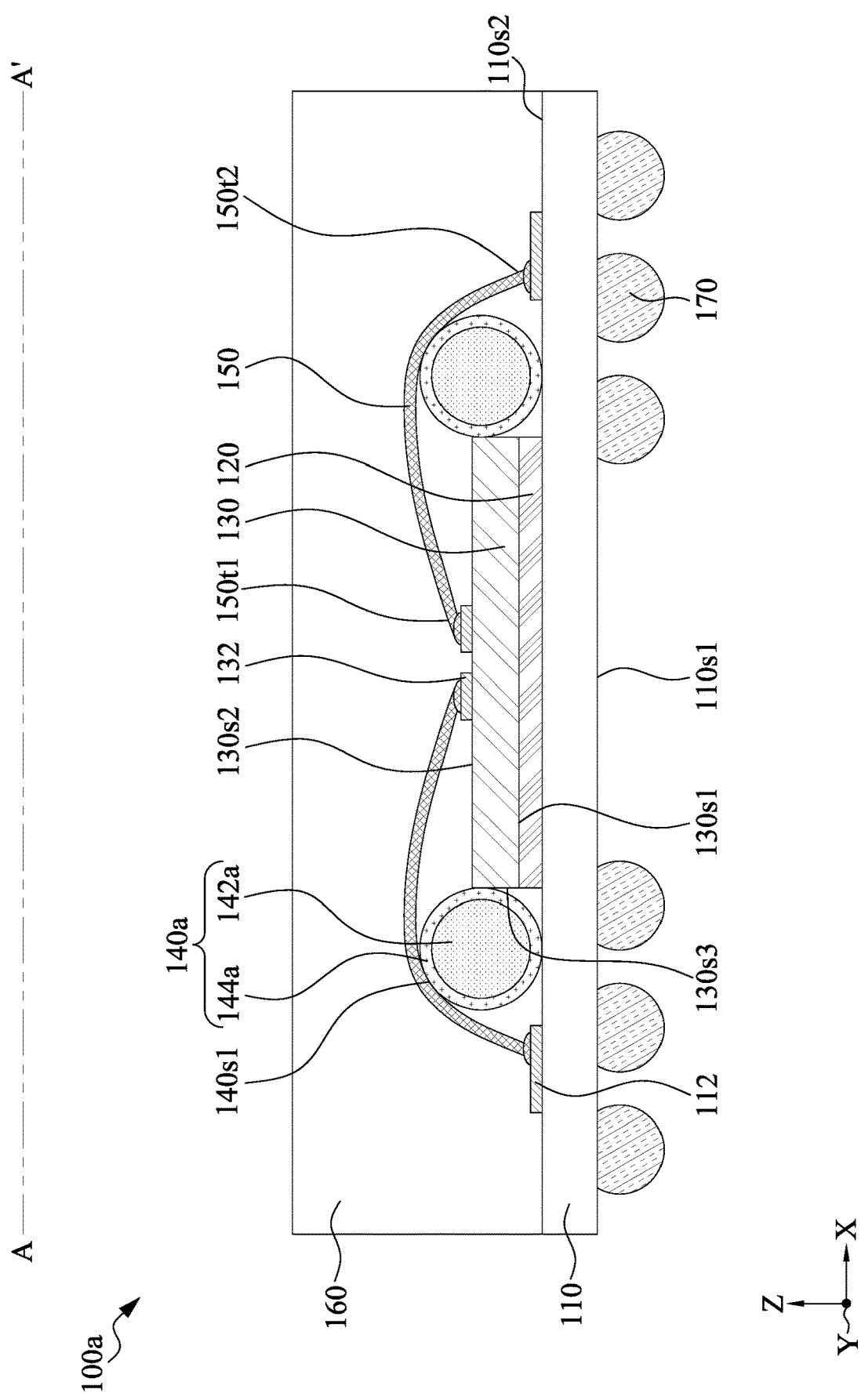
FIG. 8F illustrates one or more stages of an exemplary method for manufacturing a semiconductor device according to some embodiments of the present disclosure.

Referring to FIG. 8F, electrical connections 170 may be formed on the surface 110s1 of the substrate 110, which thereby produces the semiconductor device 100a. The electrical connection 170 may include a solder material.

It is contemplated that in FIG. 8C, if the supporter is disposed on the surface 110s2 of the substrate 110 and spaced apart from the surface 130s3 of the electronic component 130, a semiconductor device same or similar to the semiconductor device 100c as illustrated and described with reference to FIG. 3 can be formed.

It is contemplated that in FIG. 8C, if the supporter is disposed on the surface 130s2 of the electronic component 130 and spaced apart from the substrate 110, a semiconductor device same or similar to the semiconductor device 100d as illustrated and described with reference to FIG. 4 can be formed.

It is contemplated that in FIG. 8C, if the supporter is disposed on the surface 130s3 of the electronic component 130 and spaced apart from the substrate 110, a semiconductor device same or similar to the semiconductor device 100e as illustrated and described with reference to FIG. 5 can be formed.

It is contemplated that in FIG. 8C, if a plurality of supporters, each of which may be utilized to fix a corresponding bonding wire 150, are disposed on the surface 110s2 of the substrate 110, a semiconductor device the same as or similar to the semiconductor device 100f as illustrated and described with reference to FIG. 6 can be formed.

In embodiments of the present disclosure, the semiconductor device may include a supporter. The supporter may be disposed between two terminals of the bonding wire. The bonding wire may be disposed against a smooth area, such as a surface, an edge, or a corner, of the supporter with relatively little tension. Further, the length of the bonding wire may be reduced, resulting in a relatively small size of the semiconductor device and a relatively small resistance of the bonding wire.

One aspect of the present disclosure provides a semiconductor device. The semiconductor device includes a substrate, an electronic component, a bonding wire, and a supporter. The electronic component is disposed on the substrate. The bonding wire includes a first terminal connected to the electronic component and a second terminal connected to the substrate. The bonding wire is disposed against the supporter.

Another aspect of the present disclosure provides another semiconductor device. The semiconductor device includes a substrate, an electronic component, a bonding wire, and a supporter. The electronic component is disposed on the substrate. The bonding wire includes a first terminal connected to the electronic component and a second terminal connected to the substrate. The supporter is disposed between the first terminal and the second terminal of the bonding wire.

Another aspect of the present disclosure provides a method of manufacturing a semiconductor device. The method includes providing a substrate. The method also includes attaching an electronic component to the substrate. The method further includes attaching a supporter to the substrate. In addition, the method includes forming a bonding wire connecting the substrate and the electronic component. The electronic component is disposed against the bonding wire.

In embodiments of the present disclosure, the semiconductor device may include a supporter. The supporter may be disposed between two terminals of the bonding wire. The bonding wire may be disposed against a smooth area, such as a surface, an edge, or a corner, of the supporter with relatively little tension. Further, the length of the bonding wire may be reduced, resulting in a relatively small size of the semiconductor device and a relatively small resistance of the bonding wire.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
an electronic component disposed on a top surface of the substrate;
a bonding wire comprising a first terminal connected to a top surface of the electronic component and a second terminal connected to the top surface of the substrate; and
a supporter having a circular cross-sectional shape and defining a bottom point in contact with the top surface of the substrate, and positioning adjacent to a lateral surface of the electronic component, wherein the bonding wire is disposed against the supporter, wherein a diameter of the supporter is greater than a thickness of the electronic component, such that the supporter has a contacting surface at a highest point above the electronic component for the bonding wire contacting with the supporter in a tolerable tension manner so as to minimize a length of the bonding wire between the first terminal and the second terminal, wherein the contacting surface of the supporter is located out of the electronic component, the bonding wire is extended and biased against the contacting surface of the supporter in a tolerable tension manner, and a peak of the bonding wire is in contact with the contacting surface of the supporter away from the electronic component;
wherein the bonding wire has a first portion extended from the first terminal to contact with the contacting surface of the supporter and a second portion extended from the contacting surface of the supporter to the second terminal.

2. The semiconductor device of claim 1, wherein the supporter and the electronic component are arranged side-by-side to ensure the peak of the bonding wire away from the electronic component.

3. The semiconductor device of claim 1, wherein the supporter is in contact with the electronic component.

4. The semiconductor device of claim 3, wherein the contacting surface of the supporter is a round surface defined as an arc surface of the supporter.

5. The semiconductor device of claim 3, wherein the supporter is in contact with the lateral surface of the electronic component only to keep the top surface of the electronic component free from the supporter.

6. The semiconductor device of claim 5, wherein the supporter is partially in contact with the lateral surface of the electronic component.

7. The semiconductor device of claim 5, wherein the supporter has a lateral point in contact with the lateral surface of the electronic component.

8. The semiconductor device of claim 3, wherein the supporter is disposed against the lateral surface of the electronic component.

9. The semiconductor device of claim 1, wherein the supporter is spaced apart from the lateral surface of the electronic component.

10. The semiconductor device of claim 1, further comprising an encapsulant disposed on the top surface of the substrate to encapsulate the supporter, the bonding wire and the electronic component.

11. The semiconductor device of claim 1, wherein the supporter comprises a spacer having a circular cross-sectional shape, and an adhesive element covering an external circumferential surface of the spacer, such that the spacer is enclosed within the adhesive element.

12. The semiconductor device of claim 1, wherein the first terminal of the bonding wire and the lateral surface of the electronic component has a first length along a first direction substantially perpendicular to the lateral surface of the electronic component, and the second terminal and the lateral surface of the electronic component has a second length, along the first direction, less than the first length, wherein the peak of the bonding wire is supported between the second terminal of the bonding wire and the lateral surface of the electronic component to support the bonding wire in a tension manner.

13. The semiconductor device of claim 12, wherein a ratio between the first length and the second length ranges from about 1.1 to about 3.

14. The semiconductor device of claim 1, wherein an upper surface of the electronic component and the second terminal of the bonding wire has a third distance along a second direction substantially perpendicular to the upper surface of the electronic component, the supporter has the diameter along the second direction, and the diameter of the supporter is greater than the third distance.

15. The semiconductor device of claim 1, wherein the diameter of the supporter is 1.5 times greater than the first distance.

16. A method of manufacturing a semiconductor device, comprising:
    providing a substrate;
    attaching an electronic component onto a top surface of the substrate;
    attaching a supporter to the substrate adjacent to the electronic component, wherein the supporter has a circular cross-sectional shape and defines a bottom point in contact with the top surface of the substrate, wherein the supporter is positioned adjacent to a lateral surface of the electronic component; and
    forming a bonding wire to have a first terminal connecting to a top surface of the electronic component and a second terminal connecting the top surface of the substrate,
    wherein the bonding wire is disposed against the supporter, wherein a diameter of the supporter is greater than a thickness of the electronic component, such that the supporter has a contacting surface at a highest point above the electronic component for the bonding wire contacting with the supporter, wherein the contacting surface of the supporter is located out of the electronic component, the bonding wire runs across the supporter, and a peak of the bonding wire is in contact with the contacting surface of the supporter away from the electronic component;
    wherein the bonding wire is extended and biased against the contacting surface of the supporter by:
    extending a first portion of the bonding wire from the first terminal to contact with the contacting surface of the supporter; and
    extending a second portion of the bonding wire from the contacting surface of the supporter to the second terminal, such that the bonding wire is extended in a tolerable tension manner to minimize a length of the bonding wire between the first terminal and the second terminal.

17. The method of claim 16, wherein the supporter is spaced apart from the lateral surface of the electronic component.

18. The method of claim 16, wherein the supporter has a lateral point in contact with the lateral surface of the electronic component.

19. The method of claim 16, wherein the supporter is attached to the top surface of the substrate and the lateral surface of the electronic component by an adhesive element.

* * * * *